(12) United States Patent
Hawraneck

(10) Patent No.: US 8,093,892 B2
(45) Date of Patent: Jan. 10, 2012

(54) SYSTEM WITH 90 DEGREE SENSE LAYER MAGNETIC ORIENTATION

(75) Inventor: Matthias Hawraneck, Munich (DE)

(73) Assignee: Infineon Technologies AG, Neubiberg (DE)

( * ) Notice: Subject to any disclaimer, the term of this patent is extended or adjusted under 35 U.S.C. 154(b) by 764 days.

(21) Appl. No.: 12/179,240

(22) Filed: Jul. 24, 2008

(65) Prior Publication Data

US 2010/0020447 A1    Jan. 28, 2010

(51) Int. Cl.
*G01R 33/02* (2006.01)

(52) U.S. Cl. ...................... 324/252; 338/32 R
(58) Field of Classification Search .......... 324/252; 338/32 R
See application file for complete search history.

(56) References Cited

U.S. PATENT DOCUMENTS

| | | | |
|---|---|---|---|
| 5,206,590 A | 4/1993 | Dieny et al. | |
| 5,408,377 A | 4/1995 | Gurney et al. | |
| 5,452,163 A | 9/1995 | Coffey et al. | |
| 5,739,988 A | * 4/1998 | Gill | 360/324.12 |
| 6,532,164 B2 | 3/2003 | Redon et al. | |
| 6,893,734 B2 | 5/2005 | Hasegawa et al. | |
| 7,075,759 B2 | 7/2006 | Hasegawa et al. | |
| 7,298,597 B2 | 11/2007 | Carey et al. | |
| 2006/0202244 A1 | 9/2006 | Ju et al. | |
| 2006/0221509 A1 | 10/2006 | Carey et al. | |

OTHER PUBLICATIONS

"Biquadratic Interlayer Coupling in Layered Magnetic Systems", S. O. Demokritov, IOP Publishing Ltd, Mar. 25, 1997 (17 pgs.).

* cited by examiner

*Primary Examiner* — Reena Aurora
(74) *Attorney, Agent, or Firm* — Dicke, Billig & Czaja, PLLC

(57) ABSTRACT

A system including a sense layer, a first pinned layer and a first interlayer. The first pinned layer is held in a fixed magnetic orientation. The first interlayer is configured to couple the sense layer and the first pinned layer and provide a magnetic orientation in the sense layer that is 90 degrees from the fixed magnetic orientation. The magnetic orientation in the sense layer rotates in response to an external magnetic field.

20 Claims, 3 Drawing Sheets

SYSTEM WITH 90 DEGREE SENSE LAYER MAGNETIC ORIENTATION

BACKGROUND

Magnetic sensors are employed in a wide range of technological applications including automotive, industrial and consumer applications. These applications need magnetic sensors that operate reliably and take accurate measurements.

Typically, magnetic sensors include one layer of magnetic film in which the orientation of magnetization is alterable and another layer of magnetic film in which the orientation of magnetization is fixed or "pinned" in a particular direction. The magnetic film having alterable magnetization is referred to as a sense layer and the magnetic film that is fixed is referred to as a reference layer. The resistance through the magnetic sensor differs according to the orientation of magnetization in the sense layer and the reference layer.

Typically, magnetic sensors based on the tunneling magneto-resistive (TMR) effect or the giant magneto-resistive (GMR) effect use two magnetic orientations. Sometimes, the magnetic orientation of the sense layer without an external magnetic field is aligned along the length of the magnetic sensor, in a long narrow stripe, and the magnetic orientation of the reference layer is pinned via exchange coupling. Within an external magnetic field range, the resistance through the sensor stripe changes almost linearly. However, for some magnetic sensors, such as TMR sensors, shape anisotropy cannot always be used successfully.

Sometimes, one exchange coupling is used to pin the magnetic orientation of the reference layer and another exchange coupling is used to achieve a preferred magnetic orientation in the sense layer. An exchange coupling is achieved via heating a magnetic sensor above a blocking temperature in an applied magnetic field and subsequent cooling of the magnetic sensor within the magnetic field, which is also referred to as tempering the sensor. The direction of the applied magnetic field is inscribed in the magnetic layer(s). To create a linear characteristic, the magnetic orientations of the sense layer and the reference layer are rotated by 90 or 270 degrees.

When using two exchange couplings, two blocking temperatures are used to achieve the different magnetic orientations. Initially, an exchange bias is inscribed via the higher blocking temperature, which inscribes the magnetic orientation of the applied magnetic field in the system with the lower blocking temperature and the system with the higher blocking temperature. In a second tempering step, an exchange bias is inscribed in the system with the lower blocking temperature via heating the magnetic sensor to a temperature between the higher and lower blocking temperatures. However, sometimes this second tempering step causes degradation in the magnetic sensor, such as by diffusion or corrosion. Also, sometimes the second tempering step affects the system with the higher blocking temperature, where the magnetic orientation could be changed. In addition, using a system with a lower blocking temperature has negative effects on the stability of the magnetic sensor.

For these and other reasons, there is a need for the present invention.

SUMMARY

One embodiment described in the disclosure provides a system including a sense layer, a first pinned layer and a first interlayer. The first pinned layer is held in a fixed magnetic orientation. The first interlayer is configured to couple the sense layer and the first pinned layer and provide a magnetic orientation in the sense layer that is 90 degrees from the fixed magnetic orientation. The magnetic orientation in the sense layer rotates in response to an external magnetic field.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
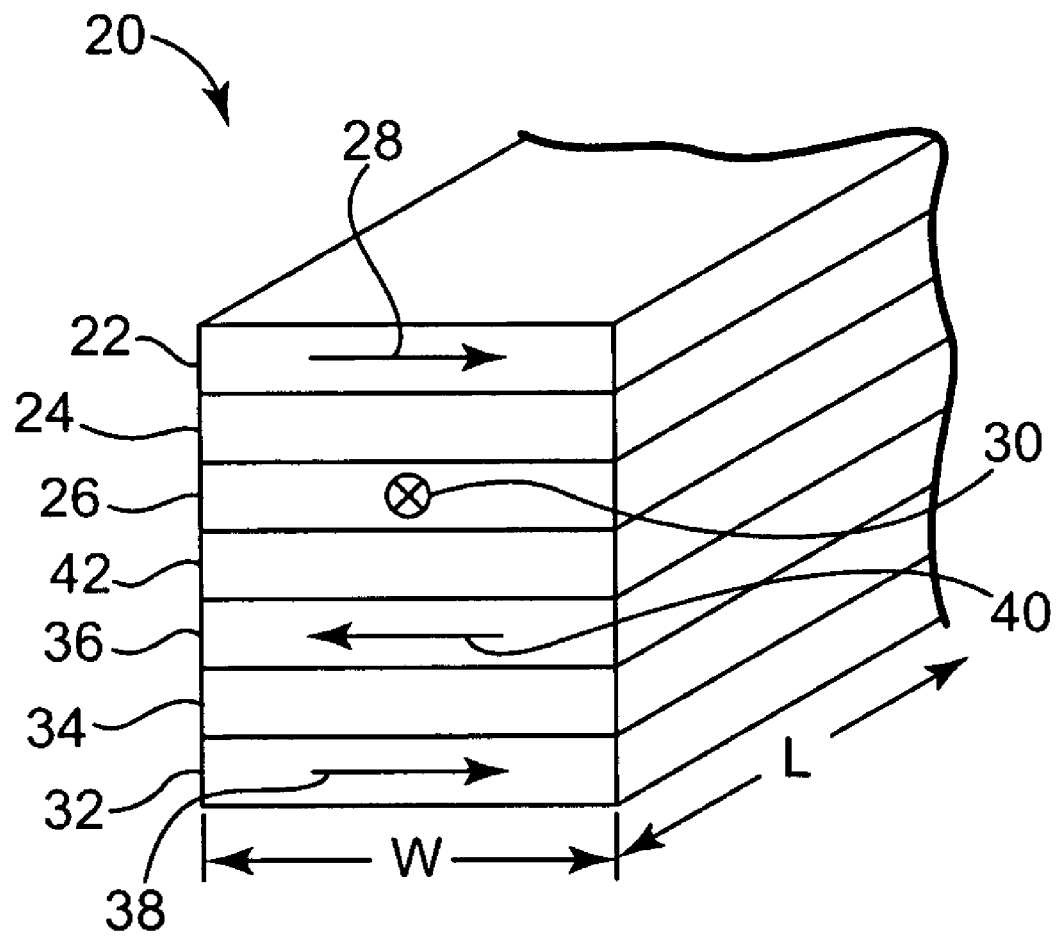
FIG. 1 is a diagram illustrating one embodiment of a magnetic sensor.

FIG. 1 is a diagram illustrating one embodiment of a magnetic sensor 20. Magnetic sensor 20 is a system having a width W and a length L. In one embodiment, magnetic sensor 20 is part of an integrated circuit. In one embodiment, magnetic sensor 20 is a discrete device. In one embodiment, magnetic sensor 20 is a substantially rectangular block of material. In one embodiment, magnetic sensor 20 is a TMR sensor that is a substantially rectangular block of material. In one embodiment, magnetic sensor 20 is a winding stripe of material. In one embodiment, magnetic sensor 20 is a GMR sensor that is a winding stripe of material.

Magnetic sensor 20 includes a first pinned layer 22, a first interlayer 24 and a sense layer 26. First interlayer 24 is situated between and in contact with first pinned layer 22 and sense layer 26. First pinned layer 22 has a fixed magnetic orientation and first interlayer 24 magnetically couples first pinned layer 22 and sense layer 26 to provide a magnetic orientation in sense layer 26 that is 90 degrees from the fixed magnetic orientation of first pinned layer 22. The magnetic orientation of first pinned layer 22 extends from left to right at 28 and the magnetic orientation of sense layer 26 extends into the page at 30. The magnetic orientation in sense layer 26 rotates in response to an external magnetic field. In one embodiment, the magnetic orientation in sense layer 26 rotates plus and minus 90 degrees to a parallel alignment with the magnetic orientation of first pinned layer 22 and to an anti-parallel alignment with the magnetic orientation of first pinned layer 22 in response to an external magnetic field.

Magnetic sensor 20 includes a second pinned layer 32, a second interlayer 34 and a reference layer 36. Second interlayer 34 is situated between and in contact with second pinned layer 32 and reference layer 36. Second pinned layer 32 has a fixed magnetic orientation that is the same as the fixed magnetic orientation of first pinned layer 22. Second interlayer 34 magnetically couples second pinned layer 32 and reference layer 36 to provide a magnetic orientation in reference layer 36 that is 180 degrees from the fixed magnetic orientation of second pinned layer 32. The magnetic orientation of second pinned layer 32 extends from left to right at 38 and the magnetic orientation of reference layer 36 extends from right to left at 40. The magnetic orientation in reference layer 36 does not rotate in response to an external magnetic field.

The magnetic orientation in reference layer 36 is 90 degrees from the magnetic orientation of sense layer 26. In one embodiment, the magnetic orientation in sense layer 26 rotates plus and minus 90 degrees to a parallel alignment with the magnetic orientation of reference layer 36 and to an anti-parallel alignment with the magnetic orientation of reference layer 36 in response to an external magnetic field.

Magnetic sensor 20 also includes a spacer layer 42 situated between and in contact with sense layer 26 and reference layer 36. Spacer layer 42 is a non-magnetized layer. In one embodiment, spacer layer 42 is copper and magnetic sensor 20 is a GMR sensor. In one embodiment, spacer layer 42 is aluminum oxide and magnetic sensor 20 is a TMR sensor. In one embodiment, spacer layer 42 is magnesium oxide and magnetic sensor 20 is a TMR sensor.

In operation, the magnetic orientation in sense layer 26 rotates in response to an external magnetic field and the magnetic orientation in reference layer 36 remains fixed in the external magnetic field. The resistance through magnetic sensor 20 differs according to the relative magnetic orientations in sense layer 26 and reference layer 36. This resistance is used to sense the direction and strength of the external magnetic field, where the resistance through magnetic sensor 20 changes almost linearly with the magnetic orientation of sense layer 26 beginning at 90 degrees from the magnetic orientation of reference layer 36.

First pinned layer 22 and second pinned layer 32 have the same fixed magnetic orientation. To manufacture magnetic sensor 20 having the same fixed magnetic orientation in first pinned layer 22 and second pinned layer 32, the material(s) for each of the layers, including first pinned layer 22 and second pinned layer 32, are put down and a magnetic field is applied to the material stack. Magnetic sensor 20 is tempered in the applied magnetic field via raising the temperature above a blocking temperature and subsequently cooling magnetic sensor 20 below the blocking temperature. The magnetic orientations in first pinned layer 22 and second pinned layer 32 align with the applied magnetic field to provide the same fixed magnetic orientation in first pinned layer 22 and second pinned layer 32. This tempering of magnetic sensor 20 needs to occur only once to provide the same fixed magnetic orientation in first pinned layer 22 and second pinned layer 32. A second tempering step in another magnetic field direction is not needed, which eliminates degradation in magnetic sensor 20, such as by diffusion or corrosion, prevents changing the fixed magnetic orientation and eliminates using a lower blocking temperature that could have negative effects on the stability of magnetic sensor 20.

Figure 2:
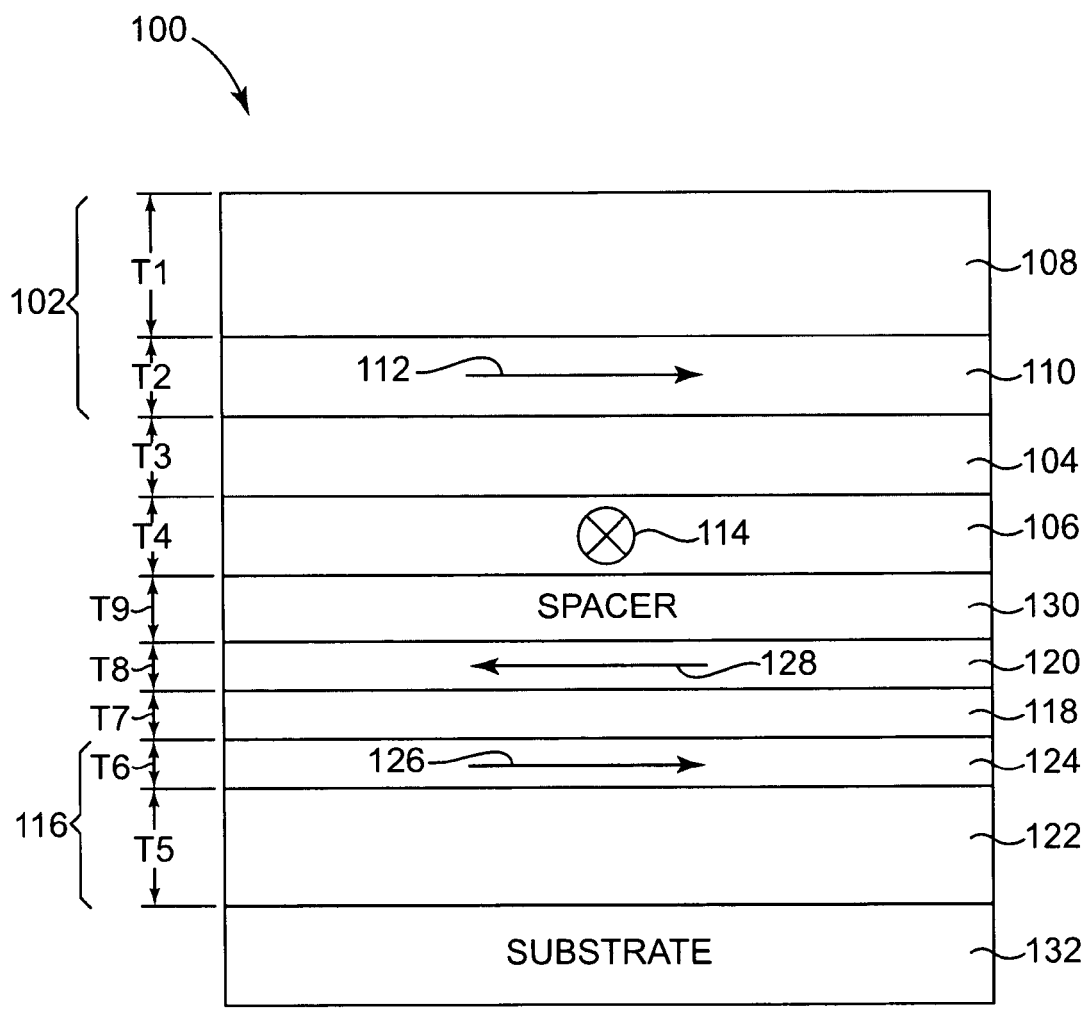
FIG. 2 is a diagram illustrating one embodiment of a magnetic sensor including material layers.

FIG. 2 is a diagram illustrating one embodiment of a magnetic sensor 100 including material layers. Magnetic sensor 100 is a system that is similar to magnetic sensor 20 of FIG. 1. In one embodiment, magnetic sensor 100 is part of an integrated circuit. In one embodiment, magnetic sensor 100 is a discrete device. In one embodiment, magnetic sensor 100 is a substantially rectangular block of material. In one embodiment, magnetic sensor 100 is a TMR sensor that is a substantially rectangular block of material. In one embodiment, magnetic sensor 100 is a winding stripe of material. In one embodiment, magnetic sensor 100 is a GMR sensor that is a winding stripe of material.

Magnetic sensor 100 includes a first pinned layer 102, a first interlayer 104 and a sense layer 106. First interlayer 104 is situated between and in contact with first pinned layer 102 and sense layer 106.

First pinned layer 102 includes a first anti-ferromagnetic layer 108 and a first pinned ferromagnetic layer 110. The magnetic orientation of first pinned ferromagnetic layer 110 is set via a tempering step, where a magnetic field is applied to magnetic sensor 100 and the temperature of magnetic sensor 100 is raised above the blocking temperature and subsequently cooled to below the blocking temperature, while magnetic sensor 100 remains in the applied magnetic field. The direction of the applied magnetic field is set in first pinned ferromagnetic layer 110 and first anti-ferromagnetic layer 108 pins the fixed magnetic orientation of first pinned ferromagnetic layer 110. For example, the fixed magnetic orientation of first pinned ferromagnetic layer 110 extends from left to right at 112. In one embodiment, first anti-ferromagnetic layer 108 is greater than 10 nanometers thick T1. In one embodiment, first pinned ferromagnetic layer 110 is substantially 2 nanometers thick T2. In one embodiment, first anti-ferromagnetic layer 108 is platinum manganese. In one embodiment, first anti-ferromagnetic layer 108 is iridium manganese. In one embodiment, first pinned ferromagnetic layer 110 is an iron oxide layer.

First interlayer 104 magnetically couples first pinned ferromagnetic layer 110 and sense layer 106 (also referred to as a free layer) to provide a magnetic orientation in sense layer 106 that is 90 degrees from the fixed magnetic orientation of first pinned ferromagnetic layer 110. Sense layer 106 is a ferromagnetic layer and the magnetic orientation of sense layer 106 extends into the page at 114. The magnetic orientation in sense layer 106 rotates in response to an external magnetic field. In one embodiment, the magnetic orientation in sense layer 106 rotates plus and minus 90 degrees to a parallel alignment with the magnetic orientation of first pinned ferromagnetic layer 110 and to an anti-parallel alignment with the magnetic orientation of first pinned ferromagnetic layer 110 in response to an external magnetic field. In one embodiment, first interlayer 104 is less than 3 nanometers thick T3. In one embodiment, first interlayer 104 is from 1 to 2 nanometers thick T3. In one embodiment, sense layer 106 is substantially 2 nanometers thick T4. In one embodiment, first interlayer 104 is a nickel oxide layer. In one embodiment, sense layer 106 is an iron oxide layer.

Magnetic sensor 100 includes a second pinned layer 116, a second interlayer 118 and a reference layer 120. Second interlayer 118 is situated between and in contact with second pinned layer 116 and reference layer 120. Second pinned layer 116 has a fixed magnetic orientation that is the same as the fixed magnetic orientation of first pinned layer 102.

Second pinned layer 116 includes a second anti-ferromagnetic layer 122 and a second pinned ferromagnetic layer 124.

The magnetic orientation of second pinned ferromagnetic layer 124 is set via the same tempering step that set the magnetic orientation of first pinned ferromagnetic layer 110, where a magnetic field is applied to magnetic sensor 100 and the temperature of magnetic sensor 100 is raised above the blocking temperature and subsequently cooled to below the blocking temperature, while magnetic sensor 100 remains in the applied magnetic field. The direction of the applied magnetic field is set in second pinned ferromagnetic layer 124 and second anti-ferromagnetic layer 122 pins the fixed magnetic orientation of second pinned ferromagnetic layer 124. For example, the fixed magnetic orientation of second pinned ferromagnetic layer 124 extends from left to right at 126. In one embodiment, second anti-ferromagnetic layer 122 is greater than 10 nanometers thick T5. In one embodiment, second anti-ferromagnetic layer 122 is substantially 15 nanometers thick T5. In one embodiment, second pinned ferromagnetic layer 124 is substantially 2 nanometers thick T6. In one embodiment, second anti-ferromagnetic layer 122 is platinum manganese. In one embodiment, second anti-ferromagnetic layer 122 is iridium manganese. In one embodiment, second pinned ferromagnetic layer 124 is a cobalt and iron layer.

Second interlayer 118 magnetically couples second pinned ferromagnetic layer 124 and reference layer 120 to provide a magnetic orientation in reference layer 120 that is 180 degrees from the fixed magnetic orientation of second pinned ferromagnetic layer 124. Reference layer 120 is a ferromagnetic layer, where the magnetic orientation of second pinned ferromagnetic layer 124 extends from left to right at 126 and the magnetic orientation of reference layer 120 extends from right to left at 128. The magnetic orientation in reference layer 120 does not rotate in response to an external magnetic field. In one embodiment, second interlayer 118 is 9 Angstroms thick T7. In one embodiment, second interlayer 118 is from 8 to 10 Angstroms thick T7. In one embodiment, reference layer 120 is substantially 2 nanometers thick T8. In one embodiment, second interlayer 118 is ruthenium. In one embodiment, reference layer 120 is a cobalt and iron layer. In one embodiment, reference layer 120 is a cobalt, iron and boron layer.

The magnetic orientation in reference layer 120 is 90 degrees from the magnetic orientation of sense layer 106. In one embodiment, the magnetic orientation in sense layer 106 rotates plus and minus 90 degrees to a parallel alignment with the magnetic orientation of reference layer 120 and to an anti-parallel alignment with the magnetic orientation of reference layer 120 in response to an external magnetic field.

Magnetic sensor 100 also includes a spacer layer 130 situated between and in contact with sense layer 106 and reference layer 120. Spacer layer 130 is a non-magnetized layer. In one embodiment, spacer layer 130 is copper and magnetic sensor 100 is a GMR sensor. In one embodiment, spacer layer 130 is copper that is substantially 2.2 nanometers thick T9. In one embodiment, spacer layer 130 is aluminum oxide and magnetic sensor 100 is a TMR sensor. In one embodiment, spacer layer 130 is magnesium oxide and magnetic sensor 100 is a TMR sensor.

In operation, the magnetic orientation in sense layer 106 rotates in response to an external magnetic field and the magnetic orientation in reference layer 120 remains fixed in the external magnetic field. The resistance through magnetic sensor 100 differs according to the relative magnetic orientations in sense layer 106 and reference layer 120. This resistance indicates the direction and strength of the external magnetic field, where the resistance through magnetic sensor 100 changes almost linearly with the magnetic orientation of sense layer 106 starting at 90 degrees from the magnetic orientation of reference layer 120.

To manufacture magnetic sensor 100, second anti-ferromagnetic layer 122 is applied to a substrate 132 and second pinned ferromagnetic layer 124 is applied over second anti-ferromagnetic layer 122. Next, second interlayer 118 is applied over second pinned ferromagnetic layer 124 and reference layer 120 is applied on second interlayer 118. Spacer layer 130 is applied on reference layer 120. Next, sense layer 106 is applied on spacer layer 130 and first interlayer 104 is applied on sense layer 106. The first pinned layer 102 is applied next, where first pinned ferromagnetic layer 110 is applied on first interlayer 104 and first anti-ferromagnetic layer 108 is applied over first pinned ferromagnetic layer 110.

To provide the same fixed magnetic orientation in first pinned layer 102 and second pinned layer 116, a magnetic field is applied to the material stack and magnetic sensor 100 is tempered in the applied magnetic field via raising the temperature above a blocking temperature and subsequently cooling magnetic sensor 100 below the blocking temperature. The magnetic orientations in first pinned ferromagnetic layer 110 and second pinned ferromagnetic layer 124 align with the applied magnetic field to provide the same fixed magnetic orientation in first pinned layer 102 and second pinned layer 116. This tempering of magnetic sensor 100 needs to occur only once to provide the same fixed magnetic orientation in first pinned layer 102 and second pinned layer 116.

First interlayer 104 magnetically couples first pinned ferromagnetic layer 110 and sense layer 106 to provide a magnetic orientation in sense layer 106 that is 90 degrees from the fixed magnetic orientation of first pinned ferromagnetic layer 110. Second interlayer 118 magnetically couples second pinned ferromagnetic layer 124 and reference layer 120 to provide a magnetic orientation in reference layer 120 that is 180 degrees from the fixed magnetic orientation of second pinned ferromagnetic layer 124. The magnetic orientation in reference layer 120 is 90 degrees from the magnetic orientation of sense layer 106.

Figure 3:
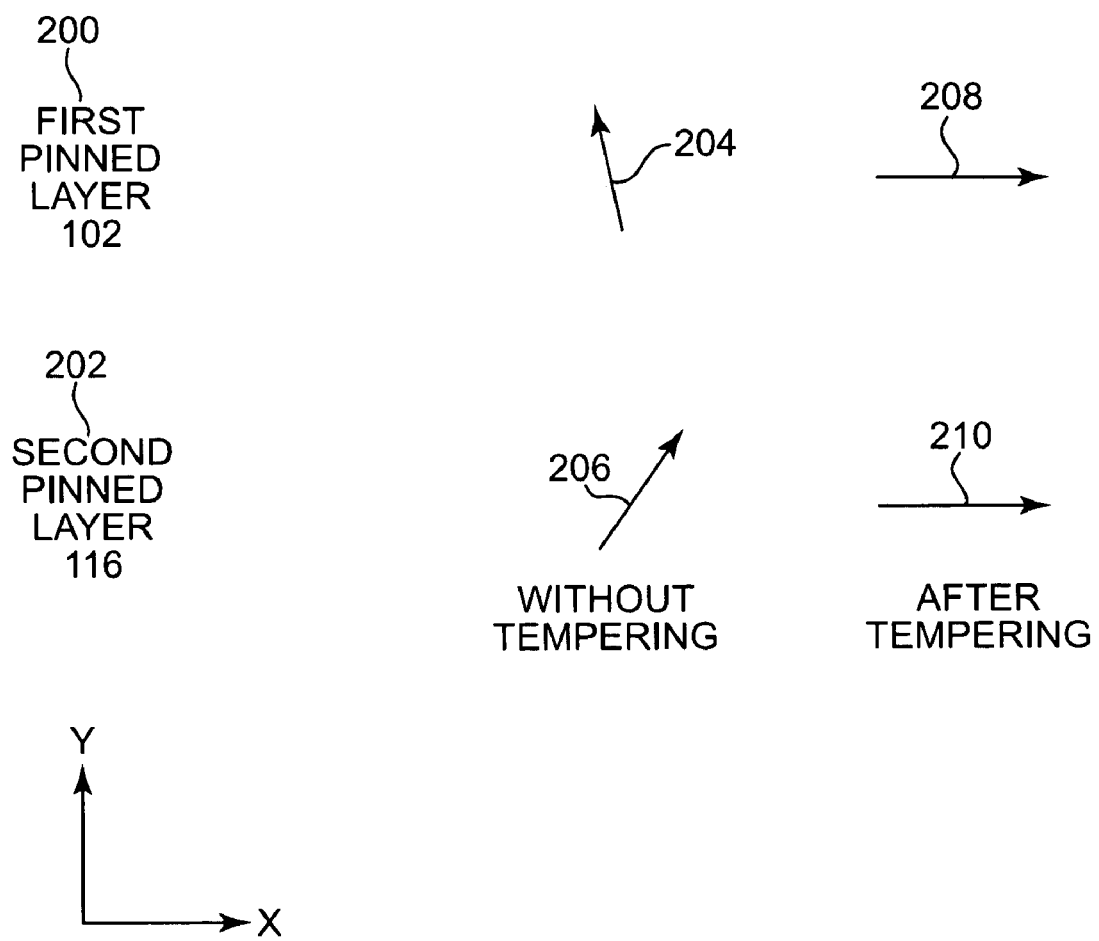
FIG. 3 is a diagram illustrating the effect of tempering on magnetic orientations in a first pinned layer and a second pinned layer.

FIG. 3 is a diagram illustrating the effect of tempering on magnetic orientations in first pinned layer 102 at 200 and second pinned layer 116 at 202. At 204, without tempering, the magnetic orientation of first pinned ferromagnetic layer 110 is slightly to the left of the y-axis and at 206, without tempering, the magnetic orientation of second pinned ferromagnetic layer 124 is to the right of the y-axis.

To temper first pinned layer 102 and second pinned layer 116, a magnetic field having a left to right direction along the x-axis is applied to magnetic sensor 100 or to the material stack that eventually makes up magnetic sensor 100. The temperature is raised above a blocking temperature and subsequently cooled to below the blocking temperature with the material stack in the applied magnetic field. The magnetic orientations in first pinned ferromagnetic layer 110 at 208 and second pinned ferromagnetic layer 124 at 210 align with the applied magnetic field along the x-axis from left to right and provide the same fixed magnetic orientation in first pinned layer 102 and second pinned layer 116.

The tempering of magnetic sensor 100 needs to occur only once to provide the same fixed magnetic orientation in first pinned layer 102 and second pinned layer 116. A second tempering step in another magnetic field direction is not needed, which eliminates degradation in magnetic sensor 100, such as by diffusion or corrosion, prevents changing the fixed magnetic orientation and eliminates using a lower blocking temperature that could have negative effects on the stability of magnetic sensor 100.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system, comprising:
   a sense layer;
   a first pinned layer held in a fixed magnetic orientation;
   a first interlayer configured to couple the sense layer and the first pinned layer and provide a magnetic orientation in the sense layer that is substantially 90 degrees from the fixed magnetic orientation, wherein the magnetic orientation in the sense layer rotates in response to an external magnetic field;
   a reference layer;
   a second pinned layer held in the fixed magnetic orientation; and
   a second interlayer configured to couple the reference layer and the second pinned layer and provide a magnetic orientation in the reference layer that is 180 degrees from the fixed magnetic orientation.

2. The system of claim 1, wherein:
   the sense layer includes a first ferromagnetic layer;
   the first pinned layer includes a second ferromagnetic layer; and
   the first interlayer includes a nickel oxide layer.

3. The system of claim 2, wherein the first ferromagnetic layer and the second ferromagnetic layer are iron oxide layers.

4. The system of claim 2, wherein the first interlayer is less than 3 nanometers thick.

5. The system of claim 1, wherein the second interlayer includes ruthenium.

6. The system of claim 1, comprising:
   a spacer layer situated between the sense layer and the reference layer.

7. The system of claim 6, wherein the spacer layer includes copper.

8. The system of claim 6, wherein the spacer layer includes one of aluminum oxide and magnesium oxide.

9. A system, comprising:
   a sense layer;
   a reference layer;
   a first pinned layer held in a fixed magnetic orientation;
   a second pinned layer held in the fixed magnetic orientation;
   a first interlayer configured to couple the sense layer and the first pinned layer and provide a magnetic orientation in the sense layer that is 90 degrees from the fixed magnetic orientation; and
   a second interlayer configured to couple the reference layer and the second pinned layer and provide a magnetic orientation in the reference layer that is 180 degrees from the fixed magnetized orientation.

10. The system of claim 9, comprising:
    a spacer layer between the sense layer and the reference layer, wherein the spacer layer is one of copper, aluminum oxide and magnesium oxide.

11. The system of claim 9, wherein the sense layer and the first pinned layer include iron oxide layers and the first interlayer includes a nickel oxide layer.

12. The system of claim 9, wherein the first interlayer includes a nickel oxide layer that is less than 3 nanometers thick.

13. The system of claim 9, wherein the first pinned layer includes one of a platinum manganese layer and an iridium manganese layer.

14. A method of sensing a magnetic field comprising:
    providing a fixed magnetic orientation in a first pinned layer;
    coupling a sense layer and the first pinned layer to provide a magnetic orientation in the sense layer that is 90 degrees from the fixed magnetic orientation;
    providing the fixed magnetic orientation in a second pinned layer; and
    coupling a reference layer and the second pinned layer to provide a magnetic orientation in the reference layer that is 180 degrees from the fixed magnetic orientation.

15. The method of claim 14, comprising:
    spacing the sense layer and the reference layer.

16. The method of claim 14, wherein coupling a sense layer and the first pinned layer comprises:
    providing a nickel oxide layer between the sense layer and the first pinned layer.

17. A method of manufacturing a sensor, comprising:
    applying a first ferromagnetic layer on a first anti-ferromagnetic layer;
    applying a second anti-ferromagnetic layer on a second ferromagnetic layer;
    applying a spacer layer vertically between the first ferromagnetic layer and the second ferromagnetic layer;
    applying a magnetic field;
    tempering the sensor only once, which establishes a fixed magnetic orientation in the first ferromagnetic layer and the second ferromagnetic layer.

18. The method of claim 17, comprising:
    applying a first interlayer on the first ferromagnetic layer; and
    applying a reference layer on the first interlayer, which establishes a magnetic orientation of the reference layer that is 180degrees from the magnetic orientation of the first ferromagnetic layer.

19. The method of claim 17, comprising:
    applying a second interlayer between a sense layer and the second ferromagnetic layer, which establishes a magnetic orientation in the sense layer that is 90 degrees from the magnetic orientation of the second ferromagnetic layer.

20. The method of claim 17, wherein applying a spacer layer comprises:
    applying one of copper, aluminum oxide and magnesium oxide.

* * * * *